(12) United States Patent
Okuda et al.

(10) Patent No.: US 7,745,306 B2
(45) Date of Patent: Jun. 29, 2010

(54) METHOD FOR PRODUCING BONDED WAFER

(75) Inventors: Hidehiko Okuda, Tokyo (JP); Tatsumi Kusaba, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/880,144

(22) Filed: Jul. 20, 2007

(65) Prior Publication Data
US 2008/0020514 A1    Jan. 24, 2008

(30) Foreign Application Priority Data
Jul. 20, 2006    (JP)    ............... 2006-197844

(51) Int. Cl.
*H01L 21/30* (2006.01)

(52) U.S. Cl. .............. 438/455; 257/E21.563; 257/E21.564

(58) Field of Classification Search ........ 438/406, 438/455–460; 257/E21.122, E21.321, E21.561, 257/E21.32, E21.563, E21.564
See application file for complete search history.

(56) References Cited

U.S. PATENT DOCUMENTS

| | | | |
|---|---|---|---|
| 6,191,007 B1 * | 2/2001 | Matsui et al. ............... | 438/459 |
| 6,211,041 B1 * | 4/2001 | Ogura ........................ | 438/458 |
| 6,534,380 B1 * | 3/2003 | Yamauchi et al. ........... | 438/455 |
| 2006/0024915 A1 * | 2/2006 | Kobayashi .................. | 438/455 |

FOREIGN PATENT DOCUMENTS

| | | |
|---|---|---|
| EP | 1045448 A1 | 10/2000 |
| EP | 1408551 A1 | 4/2004 |
| EP | 1688991 A2 | 8/2006 |
| FR | 2797714 A1 | 2/2001 |

OTHER PUBLICATIONS

European Search Report dated Sep. 27, 2007 for Application No. 07014349.0.

* cited by examiner

*Primary Examiner*—Brook Kebede
(74) *Attorney, Agent, or Firm*—Sughrue Mion, PLLC

(57) ABSTRACT

A bonded wafer is produced by a method comprising a step of implanting ions of a light element such as hydrogen, helium or the like into a wafer for active layer at a predetermined depth position to form an ion implanted layer, a step of bonding the wafer for active layer to a wafer for support substrate through an insulating film, a step of exfoliating the wafer at the ion implanted layer, a first heat treatment step of conducting a sacrificial oxidation for reducing damage on a surface of an active layer exposed through the exfoliation and a second heat treatment step of raising a bonding strength, in which the second heat treatment step is continuously conducted after the first heat treatment step without removing an oxide film formed on the surface of the active layer.

2 Claims, 2 Drawing Sheets

US 7,745,306 B2

METHOD FOR PRODUCING BONDED WAFER

BACKGROUND OF THE INVENTION

1. Field of the Invention

This invention relates to a method for producing a bonded wafer, which comprises steps of implanting ions of a light element such as hydrogen, helium or the like into a wafer for active layer at a predetermined depth position, bonding the wafer to a wafer for support substrate, and thereafter subjecting to a heat treatment to exfoliate the ion implanted portion as well as a bonded wafer produced by such a method.

2. Description of the Related Art

As the method for producing a bonded wafer, there is, for example, a so-called smart cut method comprising a step of implanting ions of a light element such as hydrogen, helium or the like into a wafer for active layer at a predetermined depth position to form an ion implanted layer, a step of bonding the wafer for active layer to a wafer for support substrate through an insulating film, a step of exfoliating the wafer at the ion implanted layer, and a step of thinning a portion of an active layer exposed by the exfoliation through polishing to form an active layer having a predetermined film thickness. According to this smart cut method, a portion of the wafer exfoliated after the bonding can be recycled as a wafer, which is different from the conventional bonding technique. By such a recycling can be used one wafer (wafer for active layer) in the bonded wafer plural times, which leads the way to reduce the material cost. Also, the wafer produced by the smart cut method is excellent in the uniformity of film thickness, so that the smart cut method is noticed as a production method with future potential.

However, as for the bonded wafer produced by the smart cut method, damage of about 100 nm remains in the exfoliated surface of the active layer due to the exfoliation of the ion implanted portion. Therefore, it is required to conduct a treatment for removing the damage, and there is a sacrificial oxidation as a typical technique therefor. When the sacrificial oxidation is conducted at a high temperature, however, there is caused a problem that dislocation existing in the damaged layer extends into the inside of the active layer during the heat treatment and comes to the surface as a surface defect at the subsequent step. Also, the wafer after the sacrificial oxidation is dipped in hydrofluoric acid (HF) to remove an oxide film and subjected to a reinforcement heat treatment and a planarization heat-treatment for enhancing the bonding strength, but the peeling of the active layer is caused by the subsequent planarization heat treatment (high-temperature heat treatment at 1000-1200° C. in an argon or hydrogen atmosphere) due to the scooping of the insulating film through the immersion in hydrofluoric acid and the lacking of the bonding strength, and hence there is caused a problem that defects are generated and the thickness uniformity of the active layer is broken.

Since the generation of defects and the scattering in the thickness of the active layer bring about significant bad influence on device characteristic and device performance of the wafer, it is desired to develop a method for producing the bonded wafer in which the generation of the defects can be effectively suppressed in the bonded wafer and the thickness uniformity of the active layer can be ensured in order to improve the quality of the bonded wafer.

SUMMARY OF THE INVENTION

It is, therefore, an object of the invention to provide a method for producing a bonded wafer in which the generation of defects in the active layer can be suppressed and the thickness can be uniformized by continuously conducting a first heat treatment step of sacrificial oxidation for reducing damage on a surface of the active layer exposed through the exfoliation and a second heat treatment step for enhancing the bonding strength under predetermined conditions.

In order to achieve the above object, the summary and construction of the invention are as follows.

(1) A method for producing a bonded wafer which comprises a step of implanting ions of a light element such as hydrogen, helium or the like into a wafer for active layer at a predetermined depth position to form an ion implanted layer, a step of bonding the wafer for active layer to a wafer for support substrate through an insulating film, a step of exfoliating the wafer at the ion implanted layer, a first heat treatment step of conducting a sacrificial oxidation for reducing damage on a surface of an active layer exposed through the exfoliation and a second heat treatment step of raising a bonding strength, in which the second heat treatment step is continuously conducted after the first heat treatment step without removing an oxide film formed on the surface of the active layer.

(2) A method for producing a bonded wafer according to item (1), wherein the first heat treatment step is a heat treatment in an oxygen atmosphere of not higher than 900° C.

(3) A method for producing a bonded wafer according to item (1) or (2), wherein the second heat treatment step is a heat treatment conducted in an oxygen or nitrogen atmosphere of not lower than 1050° C. for not less than 2 hours.

According to the invention, it is possible to provide a method for producing a bonded wafer in which the generation of defects in the active layer can be suppressed and the thickness can be uniformized by continuously conducting a first heat treatment step of sacrificial oxidation for reducing damage on a surface of the active layer exposed through the exfoliation and a second heat treatment step for enhancing the bonding strength under predetermined conditions.

DESCRIPTION OF THE PREFERRED EMBODIMENTS

The method for producing a bonded wafer according to the invention will be described with reference to the accompanying drawings below.

Figure 1:
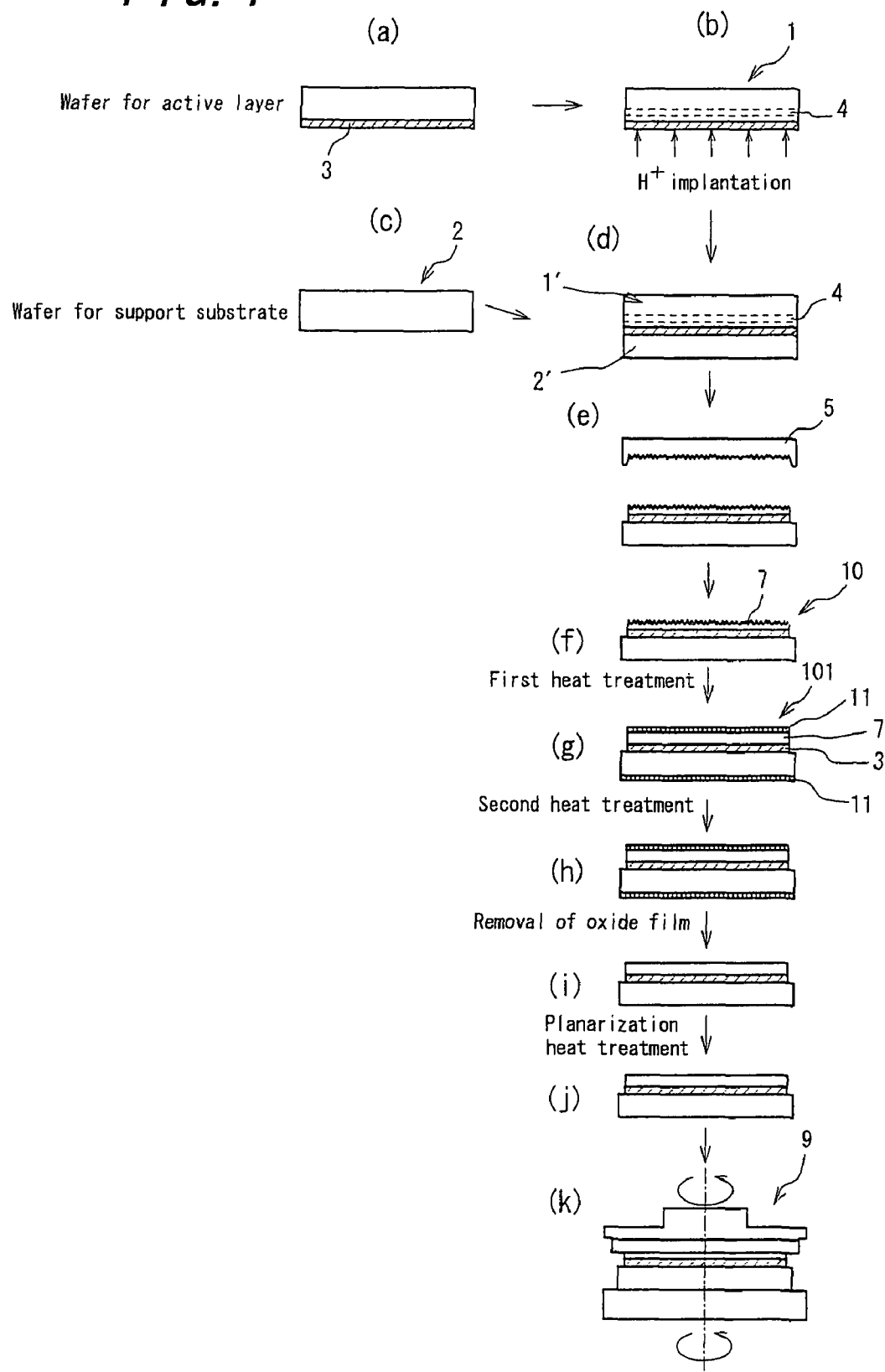
FIG. 1 is a flow chart showing production steps of a bonded wafer by a production method according to the invention, wherein (a) shows a wafer for active layer treated by a thermal oxidation, (b) shows the wafer for active layer implanted with H$^+$ ions, (c) shows a wafer for support substrate, (d) shows a state of bonding both wafers (b) and (c), (e) shows a state immediately after the exfoliation of the wafer for active layer through heat treatment, (f) shows a state of a bonded wafer after the exfoliation of the wafer for active layer, (g) shows a bonded wafer immediately after a first heat treatment, (h) shows a bonded wafer immediately after a second heat treatment, (i) shows a bonded wafer immediately after the removal of an oxide film with HF solution followed by the second heat treatment, (j) shows a bonded wafer immediately after a planarization heat treatment, and (k) shows a state of polishing the bonded wafer.

FIG. 1 is a flow chart showing steps of producing a bonded wafer by the production method of the invention.

Figure 2:
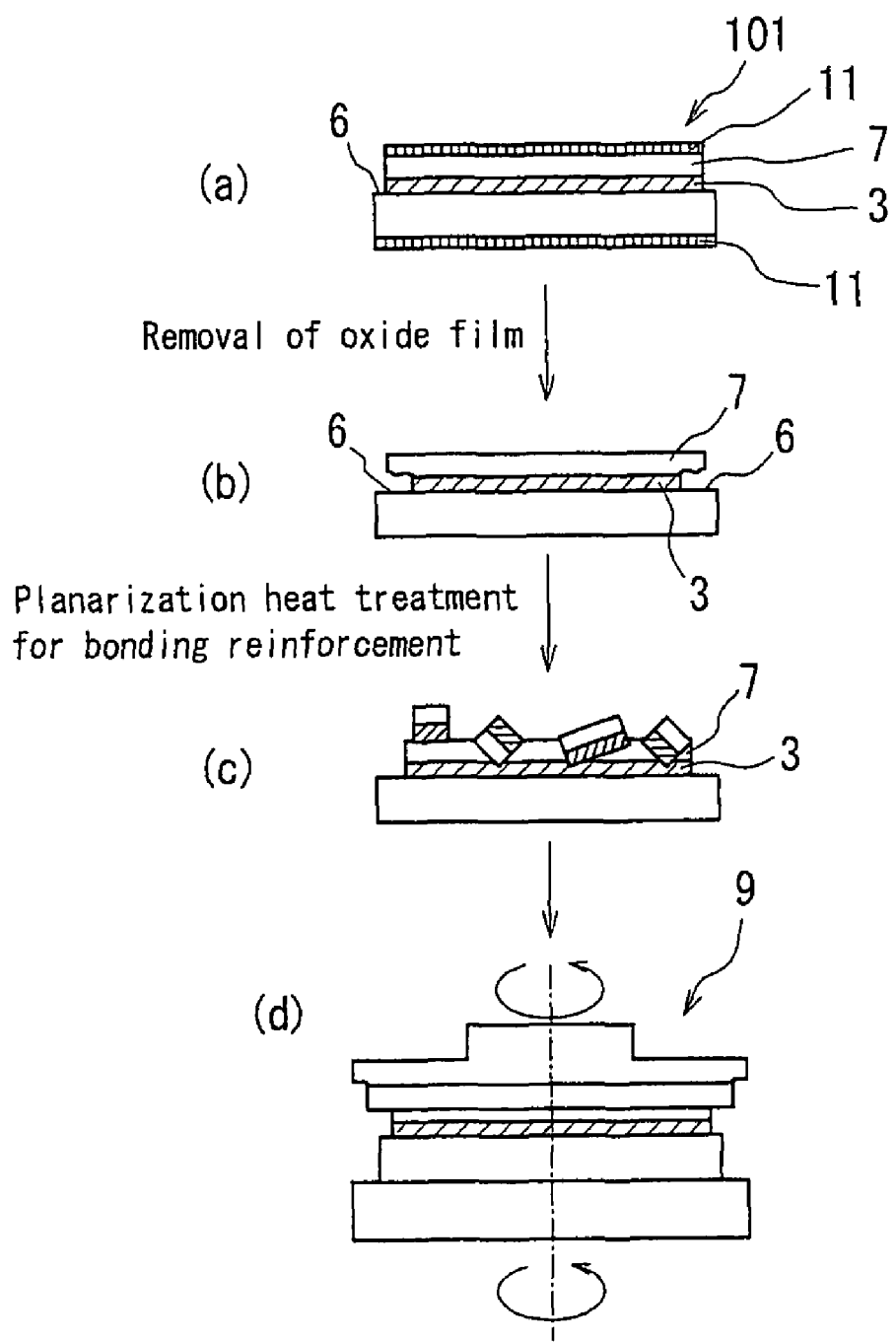
FIG. 2 is a flow chart showing a part of production steps of a bonded wafer by the conventional production method, wherein (a) shows a bonded wafer immediately after a heat treatment for sacrificial oxidation, (b) shows a bonded wafer immediately after the removal of an oxide film with HF solution after the sacrificial oxidation, (c) shows a bonded wafer immediately after a heat treatment for enhancing a bonding strength and planarizing a wafer, and (d) shows a state of polishing the bonded wafer.

The production method of the invention is a so-called smart cut method comprising steps of thermal-oxidizing at least one-side surface of a wafer 1 for active layer to form an insulating film 3 (silicon oxide film) on such a surface (FIG. 1(a)), implanting ions of a light element such as hydrogen, helium or the like into the wafer 1 for active layer at a predetermined depth position (preferably depth position of 400-600 nm) (FIG. 1(b)), bonding the wafer to a wafer 2 for support substrate and exfoliating at the ion implanted portion by a heat treatment. The bonded wafer produced by the smart cut method has a problem that defects are generated to deteriorate the yield due to damage produced on the surface of the active layer after the exfoliation at the ion implanted portion. In the conventional technique for solving this problem, as shown in FIG. 2, there is used a production method comprising a heat treatment step (FIG. 2(a)) of conducting sacrificial oxidation for reducing the damage on the surface of the active layer exposed by the exfoliation, a step of removing an oxide film on the surface of the wafer (FIG. 2(b)) and a heat treatment step (FIG. 2(c)) for enhancing the bonding strength and planarizing the wafer. However, the conventional sacrificial oxidation is carried out at a high treating temperature of about 950° C., so that there is a problem that dislocation existing in the damage on the surface of the active layer extends into the inside of the active layer during the heat treatment and comes to the surface as a surface defect at the subsequent step. Also, in the conventional technique, the neighborhood of the surface of the active layer retaining a hydrogen implanted damage is oxidized at the sacrificial oxidation step to render the damage area into $SiO_2$ (oxide film 11) and then the oxide film 11 is removed with HF solution to eliminate the damage area. In this case, however, it tends to remove a peripheral edge portion of the insulating film located at a terrace region of the wafer, which essentially should not be removed. As a result, at the subsequent heat treatment step for enhancing the bonding strength and planarizing the wafer, there is caused a problem that the active layer is partially peeled off by the planarization heat treatment to generate the defects and break the thickness uniformity of the active layer.

The inventors have made various studies on the above problems and discovered a method for producing a bonded wafer in which the bonding strength is improved without removing the peripheral edge portion of the insulating film at the bonded interface by continuously conducting the heat treatment step for enhancing the bonding strength (second heat treatment step) after the heat treatment step for sacrificial oxidation (first heat treatment) before the removal of an oxide film produced on the surface of the active layer and hence the peeling of the active layer can be prevented at the subsequent planarization heat treatment step and the generation of defects can be suppressed and the thickness can be uniformized.

In a concrete production method according to the invention, as shown in FIG. 1, ions of a light element such as $H^+$ are implanted into a wafer for active layer having a thermally oxidized insulating film 3 on its surface (FIG. 1(a)) to form an ion implanted layer 4 at a predetermined depth position from the surface (FIG. 1(b)). Then, the wafer 1 for active layer is bonded to a wafer 2 for support substrate (FIG. 1(d)) and heat-treated in a nitrogen atmosphere at a predetermined temperature, preferably within a range of 400-600° C. to exfoliate a remnant 5 of the wafer for active layer at the ion implanted layer 4 (FIG. 1(e)). Thereafter, an active layer 7 exposed by the exfoliation (FIG. 1(f)) is subjected to a sacrificial oxidation (first heat treatment step) for reducing damage on the surface of the active layer exposed by the exfoliation under predetermined conditions, preferably in an oxygen atmosphere of not higher than 900° C. as shown in FIG. 1(g). After the first heat treatment step, as shown in FIG. 1(h), the bonded wafer is subjected to a heat treatment under predetermined conditions, preferably in an oxygen or nitrogen atmosphere of not lower than 1050° C. for not less than 2 hours without conducting the removal of an oxide film on the surface of the active layer with HF solution (second heat treatment step). Then, after a step of etching and removing the oxide film 11 formed on the wafer surface by immersing the bonded wafer 101 in a predetermined cleaning solution (FIG. 1(i)), the active layer 7 is subjected to a planarization heat treatment (FIG. 1(j)) and then thinned by polishing (FIG. 1(k)). Thus, it is possible to produce a bonded wafer capable of suppressing the generation of defects in the active layer and uniformizing the film thickness.

Moreover, the first heat treatment step is preferable to be a heat treatment in an oxygen atmosphere of not higher than 900° C. When the heat treating temperature exceeds 900° C., there is a fear that the damage in the active layer 7 extends into the inside of the active layer 7 as a crystalline defect or a dislocation during the heat treatment to deteriorate the crystallinity. On the other hand, when the heat treatment is conducted in an atmosphere other than oxygen, the damaged layer cannot be completely removed.

Further, the second heat treatment step is preferable to be a heat treatment in an oxygen or nitrogen atmosphere of not lower than 1050° C. for not less than two hours. When the heat treating temperature is lower than 1050° C., the sufficient bonding strength cannot be obtained, while when the heat treatment is conducted in an atmosphere other than oxygen or nitrogen gas, the sufficient bonding strength cannot be obtained at a heat treating time of less than two hours. In case of using a reducing gas, the etching on the surface of the active layer is caused by such a gas.

Moreover, the cleaning solution used for the removal of the oxide film is not particularly limited as long as it contains hydrofluoric acid (HF), and includes, for example, a cleaning solution comprising 0.1-50% by mass of one or more organic acids selected from the group consisting of citric acid, succinic acid, ethylenediaminetetraacetic acid, tartaric acid, salicylic acid, oxalic acid, acetic acid and formic acid and 0.005-0.25% by mass of hydrofluoric acid.

In addition, the planarization heat treatment is a high-temperature heat treatment using a reduction reaction for smoothening the unevenness of the active layer surface, which includes, for example, a heat treatment at 1000-1200° C. in an argon or hydrogen atmosphere.

Although the above is merely described with reference to an embodiment of the invention, various modifications can be made within the scope of the invention.

Example 1

An oxide film of 150 nm is formed on a silicon wafer for active layer having a size of 300 mm, and thereafter ions of a hydrogen gas are implanted (acceleration voltage: 50 keV, a dose: $1 \times 10^{17}/cm^2$), and then the wafer for active layer is bonded to a wafer for support substrate. The bonded wafer is subjected to a heat treatment at 500° C. in a nitrogen atmosphere for 30 minutes to exfoliate the hydrogen ion-implanted portion. The bonded wafer after the exfoliation is subjected to a heat treatment for keeping at 850° C. in an oxygen atmosphere for 90 minutes with a vertical heat treatment furnace (first heat treatment) and further to a heat treatment for keeping at 1050° C. in an oxygen atmosphere for 120 minutes with the same heat treatment furnace (second heat-treatment). After the second heat treatment, the bonded wafer is immersed in HF solution containing 0.5% by mass of citric acid as an organic acid and 0.01% by mass of hydrofluoric acid (HF) to remove the oxide film and then subjected to a planarization heat treatment at 1100° C. in an argon atmosphere for 120 minutes to produce a bonded wafer.

Comparative Example 1

A bonded wafer id produced in the same manner as in Example 1 except that the temperature of the first heat treatment is 950° C.

Comparative Example 2

A bonded wafer is produced in the same manner as in Example 1 except that the atmospheric gas of the first heat treatment is argon.

Comparative Example 3

A bonded wafer is produced in the same manner as in Example 1 except that the temperature of the second heat treatment is 1000° C.

Example 2

A bonded wafer is produced in the same manner as in Example 1 except that the atmospheric gas of the second heat treatment is nitrogen.

Comparative Example 4

A bonded wafer is produced in the same manner as in Example 1 except that the atmospheric gas of the second heat treatment is argon.

Comparative Example 5

A bonded wafer is produced in the same manner as in Example 1 except that the treating time of the second heat treatment is one hour.

Comparative Example 6

A bonded wafer is produced in the same manner as in Example 1 except that the oxide film on the surface of the active layer is removed by immersing in HF solution after the first heat treatment step and before the second heat treatment step.

(Evaluation Method)

Each of the above wafers to be tested is immersed in HF solution (49 mass %) for about 30 minutes, during which HF defect detected in the wafer is observed by means of an optical microscope to calculate defect density per 1 square centimeter. Also, the thickness uniformity of the active layer is calculated by measuring the thickness of the active layer with a thickness measuring device and taking a difference between maximum value and minimum value of the thickness in the wafer. These measured results are shown in Table 1.

TABLE 1

HF defect density and thickness uniformity of active layer in Examples and Comparative Examples

|  | HF defect density (defects/cm$^2$) | Thickness uniformity (nm) |
| --- | --- | --- |
| Example 1 | 0.052 | 1.84 |
| Example 2 | 0.046 | 1.77 |
| Comparative Example 1 | 0.25 | 2.53 |
| Comparative Example 2 | 0.96 | 3.40 |
| Comparative Example 3 | 0.54 | 3.36 |
| Comparative Example 4 | 0.73 | 5.72 |
| Comparative Example 5 | 0.34 | 2.81 |
| Comparative Example 6 | 0.78 | 5.20 |

As seen from the result of Table 1, good numerical values of both the HF defect density and the thickness uniformity of the active layer are obtained in Examples 1 and 2 according to the invention as compared with those of the bonded wafer in Comparative Example 6 according to the conventional method. On the other hand, in Comparative Example 1 in which the temperature of the first heat treatment exceeds 900° C., Comparative Example 2 in which the atmospheric gas of the first heat treatment is a gas other than oxygen, Comparative Example 3 in which the temperature of the second heat treatment is lower than 1050° C., Comparative Example 4 in which the atmospheric gas of the second heat treatment is a gas other than oxygen or nitrogen, and Comparative Example 5 in which the treating time of the second heat treatment is less than 2 hours, the numerical values of both the HF defect density and the thickness uniformity of the active layer are worse than those of Example 1 in which each value is within the preferred range.

According to this invention, there can be provided a method for producing a bonded wafer in which the generation of defects in the active layer can be suppressed and the thickness can be uniformized by continuously conducting the first heat treatment step of sacrificial oxidation for reducing damage on the surface of the active layer exposed by the exfoliation and the second heat treatment step for enhancing the bonding strength under the predetermined conditions.

What is claimed is:

1. A method for producing a bonded wafer, the method comprising:

implanting ions of a light element such as hydrogen, helium or the like into a wafer for active layer at a predetermined depth position to form an ion implanted layer;

bonding the wafer for active layer to a wafer for support substrate through an insulating film;

exfoliating the wafer at the ion implanted layer at a heat temperature of between 400 and 600 degrees Celsius;

a first heat treatment step, carried out at a first temperature, for conducting a sacrificial oxidation for reducing damage on a surface of an active layer exposed through the exfoliation; and a second heat treatment step, carried out at a second temperature, for raising a bonding strength, the second heat treatment step being continuously conducted after the first heat treatment step without removing an oxide film formed on the surface of the active layer, wherein the second temperature is higher than the first temperature;

a cleaning step occurring after the second heat treatment step, and a planarization heat treatment step occurring after the cleaning step;

wherein the first heat treatment step is a heat treatment in an oxygen atmosphere of not higher than 900° C.

2. A method for producing a bonded wafer according to claim 1, wherein the second heat treatment step is a heat treatment conducted in an oxygen or nitrogen atmosphere of not lower than 1050° C. for not less than 2 hours.

* * * * *